(12) United States Patent
Liu et al.

(10) Patent No.: US 7,791,084 B2
(45) Date of Patent: Sep. 7, 2010

(54) PACKAGE WITH OVERLAPPING DEVICES

(75) Inventors: Yong Liu, Scarborough, ME (US); Yumin Liu, Jiangsu (CN)

(73) Assignee: Fairchild Semiconductor Corporation, South Portland, ME (US)

( * ) Notice: Subject to any disclaimer, the term of this patent is extended or adjusted under 35 U.S.C. 154(b) by 132 days.

(21) Appl. No.: 11/971,512

(22) Filed: Jan. 9, 2008

(65) Prior Publication Data
US 2009/0173953 A1 Jul. 9, 2009

(51) Int. Cl.
*H01L 31/16* (2006.01)
(52) U.S. Cl. .................... 257/82; 257/81; 257/E33.076
(58) Field of Classification Search .................. 257/81, 257/82, E33.076
See application file for complete search history.

(56) References Cited

U.S. PATENT DOCUMENTS

| | | | |
|---|---|---|---|
| 4,712,017 A | * | 12/1987 | Kamasaki .................... 250/551 |
| 5,545,893 A | * | 8/1996 | Brown et al. ................. 250/239 |
| 5,770,867 A | * | 6/1998 | Sata et al. ..................... 257/81 |
| 6,133,634 A | | 10/2000 | Joshi |
| 6,329,706 B1 | | 12/2001 | Nam |
| 6,424,035 B1 | | 7/2002 | Sapp et al. |
| 6,432,750 B2 | | 8/2002 | Jeon et al. |
| 6,449,174 B1 | | 9/2002 | Elbanhawy |
| 6,489,678 B1 | | 12/2002 | Joshi |
| 6,556,749 B2 | | 4/2003 | Uetsuka et al. |
| 6,556,750 B2 | | 4/2003 | Constantino et al. |
| 6,574,107 B2 | | 6/2003 | Jeon et al. |
| 6,621,152 B2 | | 9/2003 | Choi et al. |
| 6,627,991 B1 | | 9/2003 | Joshi |
| 6,645,791 B2 | | 11/2003 | Noquil et al. |
| 6,674,157 B2 | | 1/2004 | Lang |
| 6,683,375 B2 | | 1/2004 | Joshi et al. |
| 6,696,321 B2 | | 2/2004 | Joshi |
| 6,720,642 B1 | | 4/2004 | Joshi et al. |
| 6,731,003 B2 | | 5/2004 | Joshi et al. |
| 6,740,541 B2 | | 5/2004 | Rajeev |
| 6,756,689 B2 | | 6/2004 | Nam et al. |
| 6,774,465 B2 | | 8/2004 | Lee et al. |
| 6,777,786 B2 | | 8/2004 | Estacio et al. |
| 6,777,800 B2 | | 8/2004 | Madrid et al. |
| 6,806,580 B2 | | 10/2004 | Joshi et al. |
| 6,830,959 B2 | | 12/2004 | Estacio |
| 6,836,023 B2 | | 12/2004 | Joshi et al. |
| 6,867,481 B2 | | 3/2005 | Joshi et al. |
| 6,867,489 B1 | | 3/2005 | Estacio |

(Continued)

FOREIGN PATENT DOCUMENTS

JP 06021506 A * 1/1994

OTHER PUBLICATIONS

U.S. Appl. No. 11/861,967, Liu et al.

(Continued)

*Primary Examiner*—Allan R. Wilson
(74) *Attorney, Agent, or Firm*—Townsend and Townsend and Crew LLP

(57) ABSTRACT

A die package is disclosed. The die package includes a substrate, a first device attached to the substrate, and a leadframe structure attached to the substrate. The leadframe structure includes a portion disposed over the first device, and a second device is attached to the first portion of the leadframe structure.

22 Claims, 7 Drawing Sheets

U.S. PATENT DOCUMENTS

| | | | |
|---|---|---|---|
| 6,891,256 | B2 | 5/2005 | Joshi et al. |
| 6,891,257 | B2 | 5/2005 | Chong et al. |
| 6,893,901 | B2 | 5/2005 | Madrid |
| 6,943,434 | B2 | 9/2005 | Tangpuz et al. |
| 6,989,588 | B2 | 1/2006 | Quinones et al. |
| 6,992,384 | B2 | 1/2006 | Joshi et al. |
| 7,022,548 | B2 | 4/2006 | Joshi et al. |
| 7,023,077 | B2 | 4/2006 | Madrid |
| 7,029,947 | B2 | 4/2006 | Joshi |
| 7,061,077 | B2 | 6/2006 | Joshi |
| 7,061,080 | B2 | 6/2006 | Jeun et al. |
| 7,081,666 | B2 | 7/2006 | Joshi et al. |
| 7,122,884 | B2 | 10/2006 | Cabahug et al. |
| 7,154,168 | B2 | 12/2006 | Joshi et al. |
| 7,157,799 | B2 | 1/2007 | Noquil et al. |
| 2007/0063125 | A1* | 3/2007 | Downing, Jr. ............... 250/205 |
| 2008/0087900 | A1* | 4/2008 | Yang ........................... 257/82 |
| 2009/0057852 | A1* | 3/2009 | Madrid ....................... 257/670 |

OTHER PUBLICATIONS

U.S. Appl. No. 11/948,081, Liu et al.
U.S. Appl. No. 11/971,524, Liu et al.
U.S. Appl. No. 11/948,170, Liu et al.
U.S. Appl. No. 11/971,556, Liu et al.
U.S. Appl. No. 12/024,847, Liu et al.
U.S. Appl. No. 11/861,967, filed Sep. 26, 2007 entitled "Stacked Dual-Die Packages, Methods of Making, and Systems Incorporating Said Packages".
U.S. Appl. No. 11/948,081, filed Nov. 30, 2007 entitled "Package Including Oriented Devices".
U.S. Appl. No. 11/971,524, filed Jan. 9, 2008 entitled "Semiconductor Die Packages Having Overlapping Dies, System Using the Same, and Methods of Making the Same".
U.S. Appl. No. 11/948,170, filed Nov. 30, 2007 entitled "Package Including Clip Attach Structure".
U.S. Appl. No. 11/971,556, filed Jan. 9, 2008 entitled "Die Package Including Substrate With Molded Device".
U.S. Appl. No. 12/024,847, filed Feb. 1, 2008 entitled "Thin Compact Semiconductor Die Packages suitable for Smart-Power Modules, Methods of Making the Same, and Systems Using".

* cited by examiner

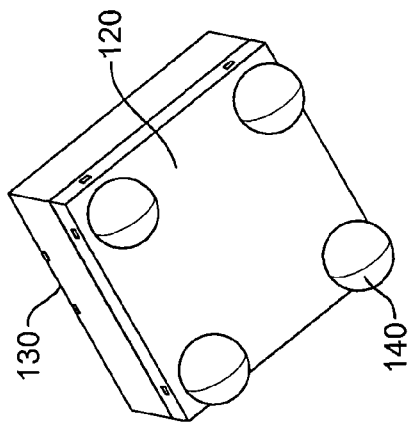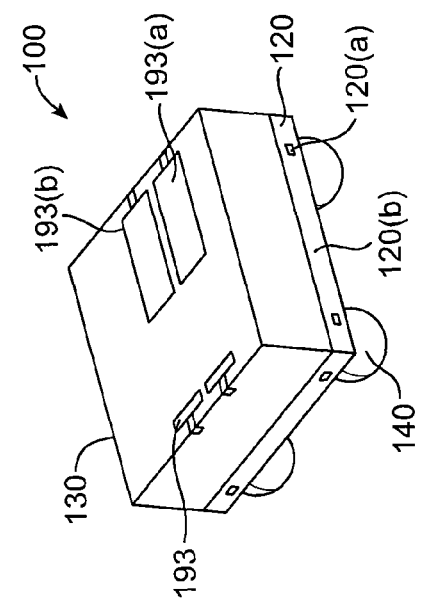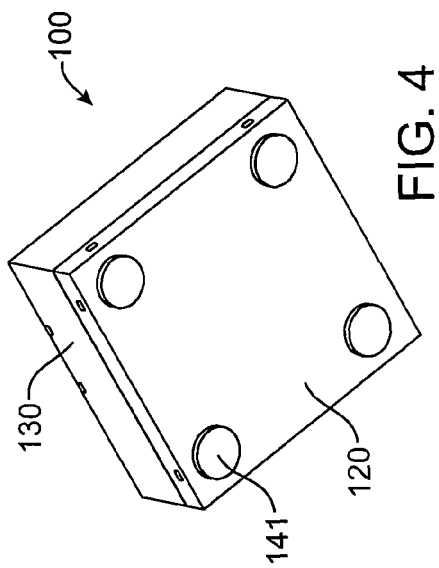

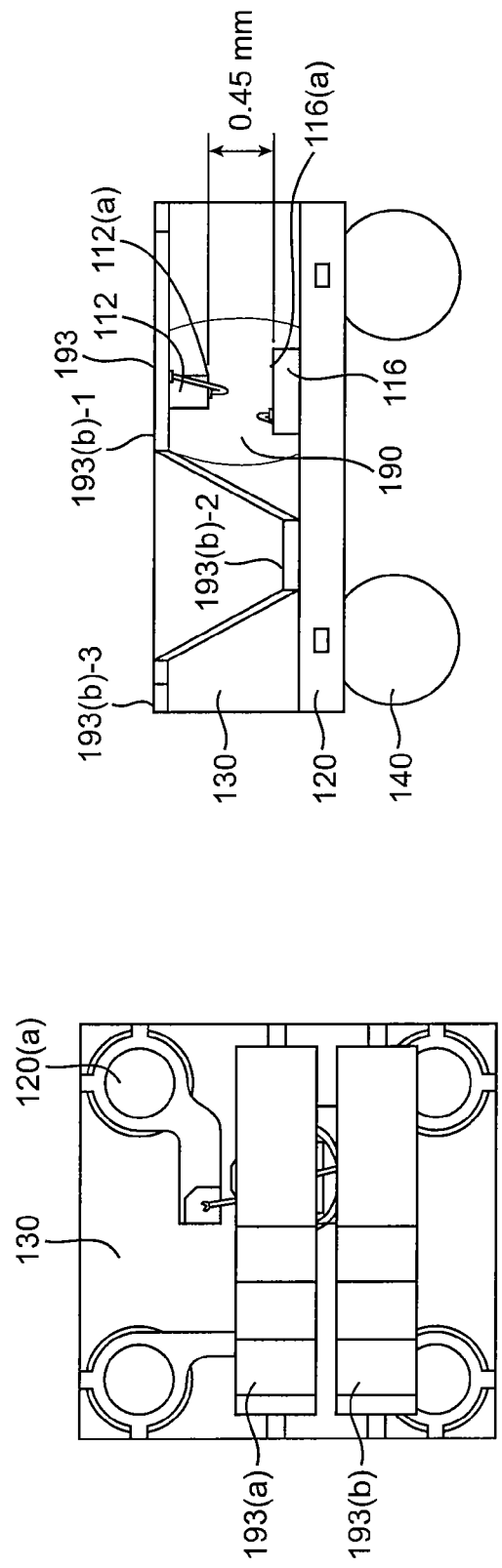
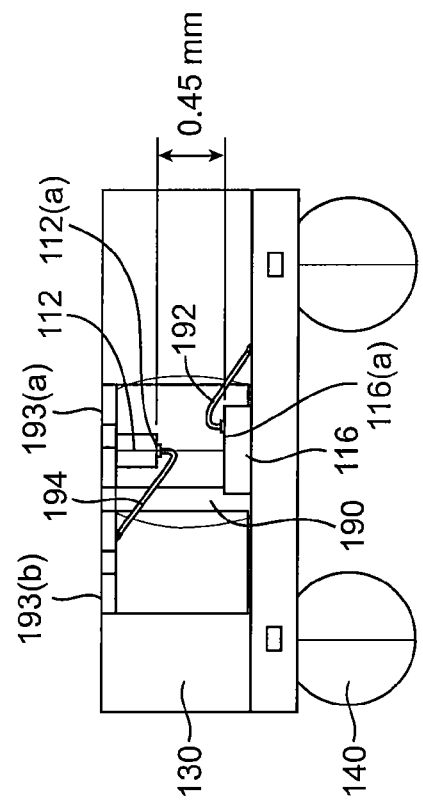
FIG. 6
FIG. 7
FIG. 8

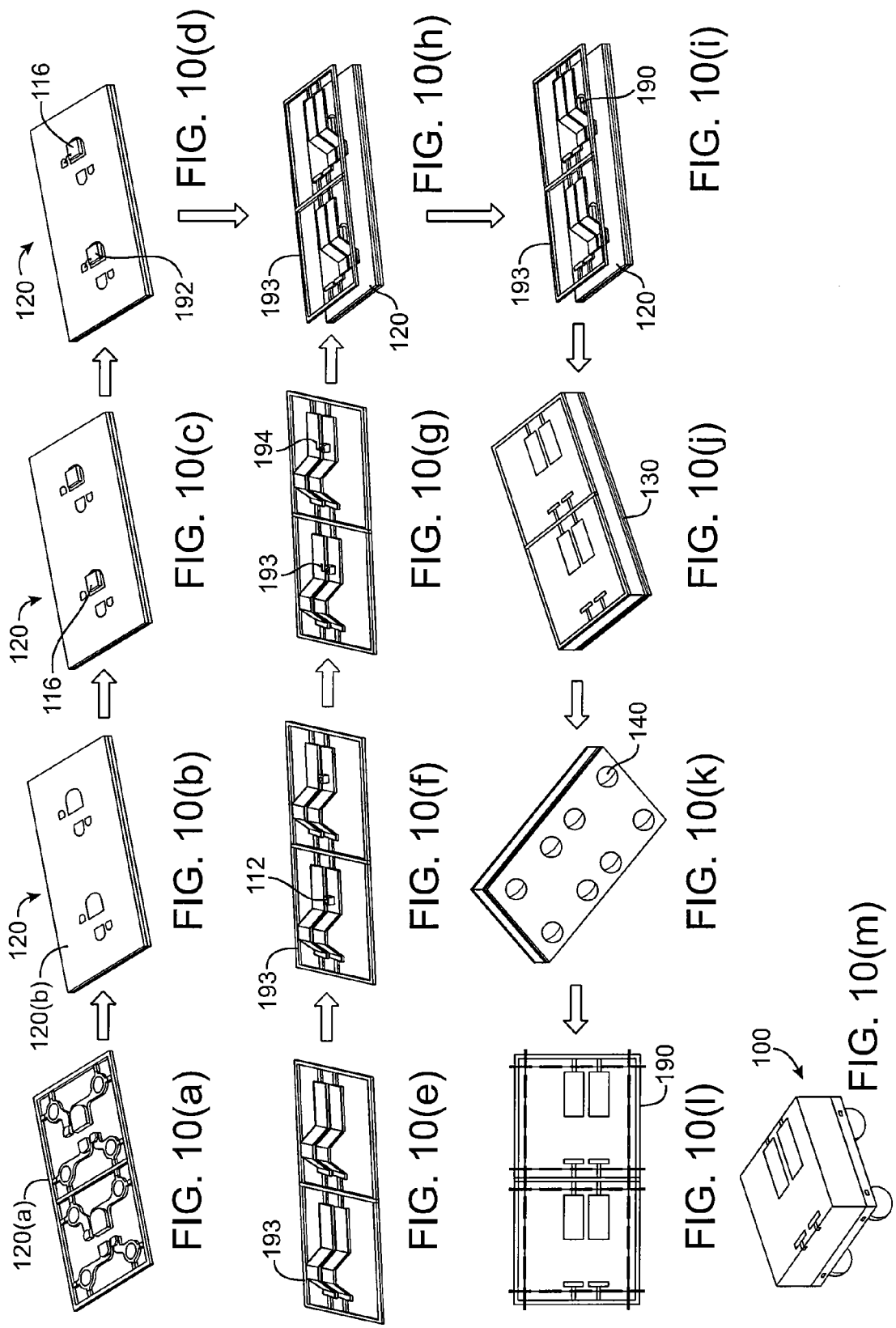

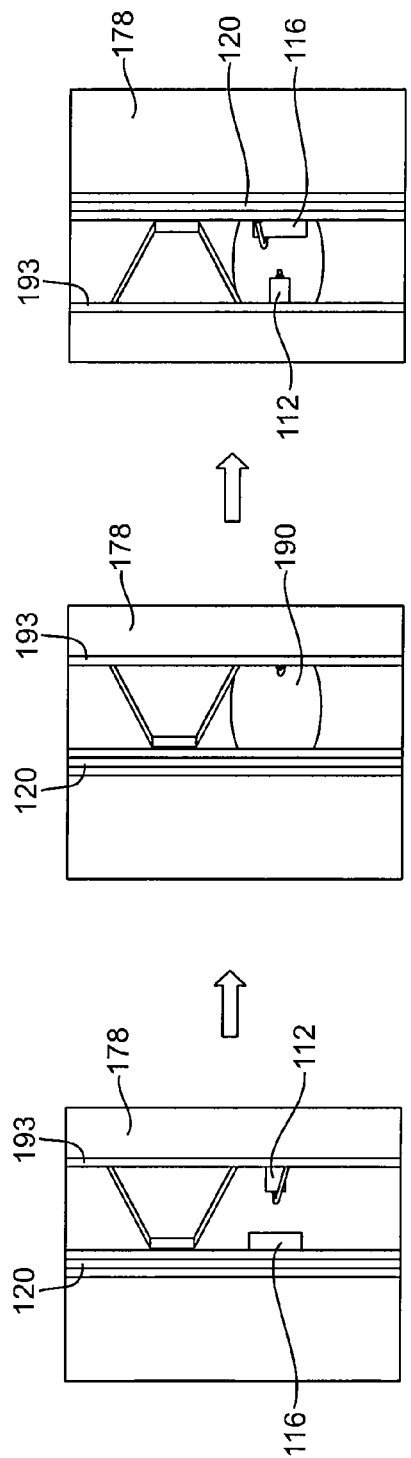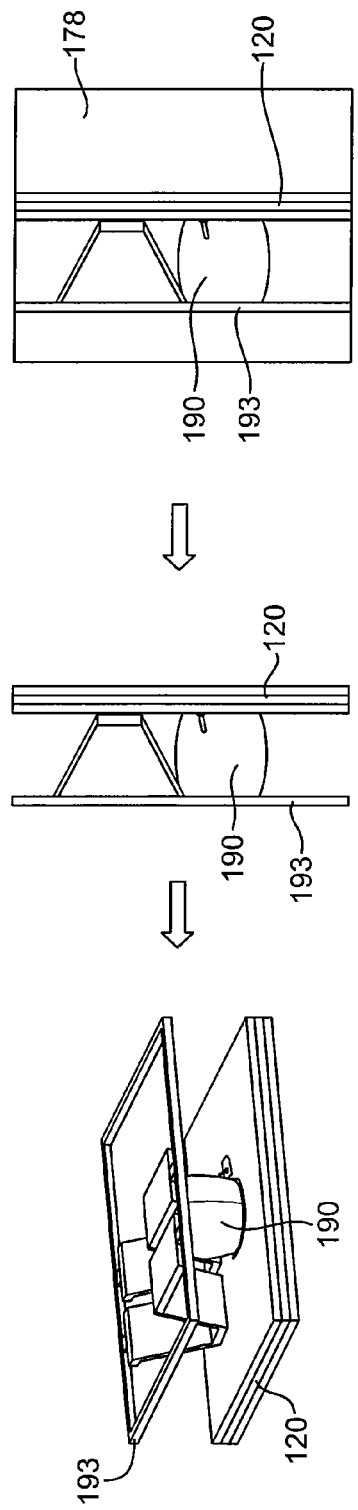

PACKAGE WITH OVERLAPPING DEVICES

CROSS-REFERENCE TO RELATED APPLICATIONS

Not applicable.

BACKGROUND

Optocouplers contain at least one optical emitter device which is optically coupled to an optical receiver device through an optically transmissive medium. This arrangement permits the passage of information from one electrical circuit that contains the optical emitter device to another electrical circuit that contains the optical receiver device. A high degree of electrical isolation is maintained between the two circuits. Because information is passed optically across an insulating gap, the transfer is one way. For example, the optical receiver device cannot modify the operation of a circuit containing the optical emitter device. This feature is desirable because, for example, the emitter may be driven by a low voltage circuit using a microprocessor or logic gates, while the output optical receiver device may be part of a high voltage DC or AC load circuit. The optical isolation also prevents damage to the input circuit caused by the relatively hostile output circuit.

FIG. 1 shows a side view of a conventional optocoupler package 10. The illustrated optocoupler 10 includes a substrate 24, and solder balls 18 on the substrate 24. An LED (light emitting diode) device 16 including an optical emitter surface 16(a) and a phototransistor device 12 (including an optical receiver surface 12(a)) are on the substrate 24 and are covered by an optically transmissive medium 22.

The output current generated by phototransistor (diode) device 12 is low (e.g., about several nA, the same level as noise) due to the low efficiency of the phototransistor 12 device to receive very limit light emitting by LED. The optical receiver surface 12(a) of photo transistor 12 does not face the optical emitting surface 16(a) of LED device 16. Consequently, light rays 20 from the LED device 16 hit the optical receiver device 12 and the optical receiver surface 12(a) of photo transistor (or diode) less than 10% of the time.

In addition, the positions of the LED device 16 and the phototransistor 12 are defined by the pads formed in the substrate 24. This can limit one's ability to form optocoupler packages with different device configurations.

Embodiments of the invention address this problem and other problems, individually and collectively.

SUMMARY

Embodiments of the invention are directed to optocoupler packages, optocoupler assemblies, and methods for making the same.

One embodiment of the invention is directed to a package. The package comprises: a substrate; a first device attached to the substrate; a leadframe structure attached to the substrate, wherein the leadframe structure comprises a first portion disposed over the first device; and a second device attached to the first portion of the leadframe structure.

Another embodiment of the invention is directed to an optocoupler package comprising: a substrate; a first optoelectronic device attached to the substrate; a leadframe structure attached to the substrate, wherein the leadframe structure comprises a first portion disposed over the first optoelectronic device; and a second optoelectronic device attached to the first portion of the leadframe structure.

Another embodiment of the invention is directed to a method for making a package. The method comprises: obtaining a substrate; attaching a first device to the substrate; attaching a second device to a portion of a leadframe structure; and attaching the leadframe structure to the substrate, wherein the portion of the leadframe structure is positioned over the first device.

Another embodiment of the invention is directed to a method for making an optocoupler package, the method comprising: obtaining a substrate; attaching a first optoelectronic device to the substrate; attaching a second optoelectronic device to a portion of a leadframe structure; and attaching the leadframe structure to the substrate, wherein the portion is positioned over the first optoelectronic device.

These and other embodiments of the invention are described in further detail below with reference to the Drawings.

BRIEF DESCRIPTION OF THE DRAWINGS

FIG. 2 shows a top perspective view of an optocoupler package according to an embodiment of the invention.

FIG. 3 shows a bottom perspective view of the optocoupler package embodiment shown in FIG. 2.

FIG. 4 shows a bottom perspective view of another optocoupler package embodiment with conductive lands.

FIG. 6. shows a top view of the optocoupler package embodiment shown in FIG. 2.

FIGS. 7-8 respectively show different side views of the optocoupler package embodiment shown in FIG. 2.

FIGS. 10(a)-10(m) show various precursors that are created during the formation of an optocoupler package according to an embodiment of the invention.

FIGS. 11(a)-11(f) show precursors that are created during the formation of an optocoupler package according to an embodiment of the invention.

In the Figures, like numerals designate like elements and descriptions of some elements may not be repeated in some instances.

DETAILED DESCRIPTION

Figure 1:
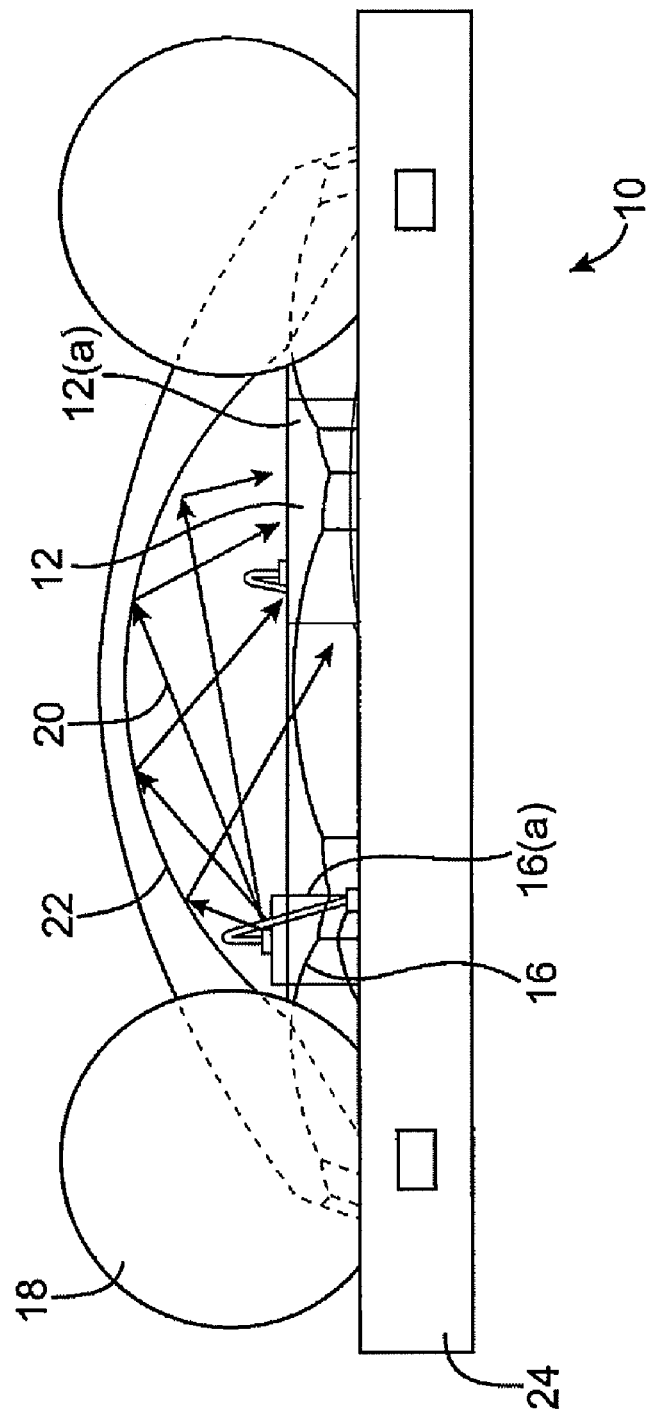
FIG. 1 shows a side view of a conventional optocoupler.

Some embodiments of the invention are directed to methods for designing a three-dimensional structure for an optocoupler, which allows a phototransistor device (or diode device) to directly face the emissive area of an LED device. This improves photoelectrical transition efficiency in the optocoupler.

In embodiments of the invention, a formed leadframe structure can hold the LED device so that it is above the phototransistor device (or diode device) in the optocoupler package, so that they are centrally aligned. The upper formed leadframe structure, which holds the LED device, may also serve as a heat sink. Therefore, this design provides a solution for high power LED optocouplers that generate heat. Other embodiments of the invention are directed to methods for assembly, gel dome generation, and molding.

Embodiments of the invention improve the photoelectrical transition ratio between an LED device and a phototransistor device (or diode device) by directly facing the LED emitter surface to the optical receiver surface of the phototransistor device (or diode device) in the optocoupler package. Light from the LED device consequently hits the optical receiver surface of the phototransistor device (or diode device) more than 80% of the time. As noted above, in embodiments of the invention, an LED device is positioned above a phototransistor device (or a diode device). Embodiments of the invention also provide a potential solution for any optocoupler package with a higher power LED device. Embodiments of the invention may also advantageously use a standard BGA type of foot print or may use a standard surface mount type of foot print (e.g., an LGA or land grid array foot print, without solder balls).

Although the specific embodiments described herein primarily focus on optocoupler packages, it is understood that embodiments of the invention can apply to packages that can have purely electrical characteristics (e.g., without optical transmission).

One embodiment of the invention is directed to a package including a substrate, a first device attached to the substrate, and a leadframe structure attached to the substrate. The leadframe structure comprises a first portion, which is disposed over the first device. A second device is attached to the first portion of the leadframe structure and is also disposed over the first device. The first and second devices are preferably optoelectronic devices, but could be purely electrical devices such as MOSFETs, control ICs, etc. Exemplary optoelectronic devices can include electrical as well as optical properties (e.g., an electrical input and an optical output, or vice-versa).

The specific examples described below include first and second optoelectronic devices in a single optocoupler package. The first optoelectronic device may be an optical receiver device such as a phototransistor device. The second optoelectronic device may be an optical emitter device such as an LED device. The first optoelectronic device may have a receiver surface for receiving light and the second optoelectronic device may have an emitter surface for emitting light. In embodiments of the invention, the emitter surface may face the receiver surface.

FIG. 2 shows a top perspective view of an optocoupler package 100 according to an embodiment of the invention. While the package 100 may have any suitable dimensions, exemplary dimensions may be about 3.5×3.5×(1.3 or 2) mm$^3$. Thus, the package 100 can have dimensions less than about 5 mm$^3$ in some embodiments.

The optocoupler package 100 comprises a first leadframe structure 193 comprising first linear section 193(a) and a second linear section 193(b). A housing 130 comprising a molding material may cover at least part of the first leadframe structure 193. Surfaces of the first and second linear sections 193(a), 193(b) of the first leadframe structure 193 are exposed through the housing 130 and are substantially coplanar with a top exterior surface of the housing 130. The housing 130 comprising the molding material (e.g., an epoxy molding material) is formed on a top surface of a substrate 120 comprising another molding material 120(b) and a second leadframe structure 120(a). Although the molding material used to form the substrate 120 and the molding material 120(b) may be the same (or different), an interface may be formed between the substrate 120 and the molding material 120(b).

The first and second leadframe structures 193, 120(a) can be formed of any suitable conductive material and may have any suitable configuration. Suitable materials for leadframe structures include copper, aluminum, and alloys thereof. In some embodiments, the leadframe structures can be plated with solderable metals or other types of metals (e.g., Ni, Pd, etc.). Furthermore, the leadframe structures may be formed as continuous or discontinuous sections of metal.

To provide electrical connections to the devices in the optocoupler package 100, a plurality of solder balls 140 is disposed on a bottom surface of the substrate 120. While many of the specific embodiments discussed with reference to the figures use solder balls, it is understood that the solder balls could be replaced by other suitable conductive structures including conductive columns (e.g., electroplated columns such as electroplated copper columns).

The substrate 120 is a "premolded substrate" in this embodiment. A typical premolded substrate comprises a leadframe structure and a molding material. The leadframe structure typically comprises a main area with a plurality of leads extending from the main area. The molding material exposes one or more surfaces of the leadframe structure. Further details regarding the premolded substrates can be found in U.S. Pat. No. 7,061,077, which is herein incorporated by reference in its entirety for all purposes. Other types of substrates may include conventional interposers, printed circuit boards, etc.

FIG. 3 shows a bottom perspective view of the optocoupler package shown in FIG. 2.

FIG. 4 shows a bottom perspective view of another optocoupler package embodiment with conductive lands 141. Solder or some other conductive adhesive may be disposed on a circuit board (not shown) and the optocoupler package 100 shown in FIG. 4 may be attached to the conductive adhesive to provide an electrical and mechanical connection between the circuit board and the optocoupler package 100.

Figure 5:
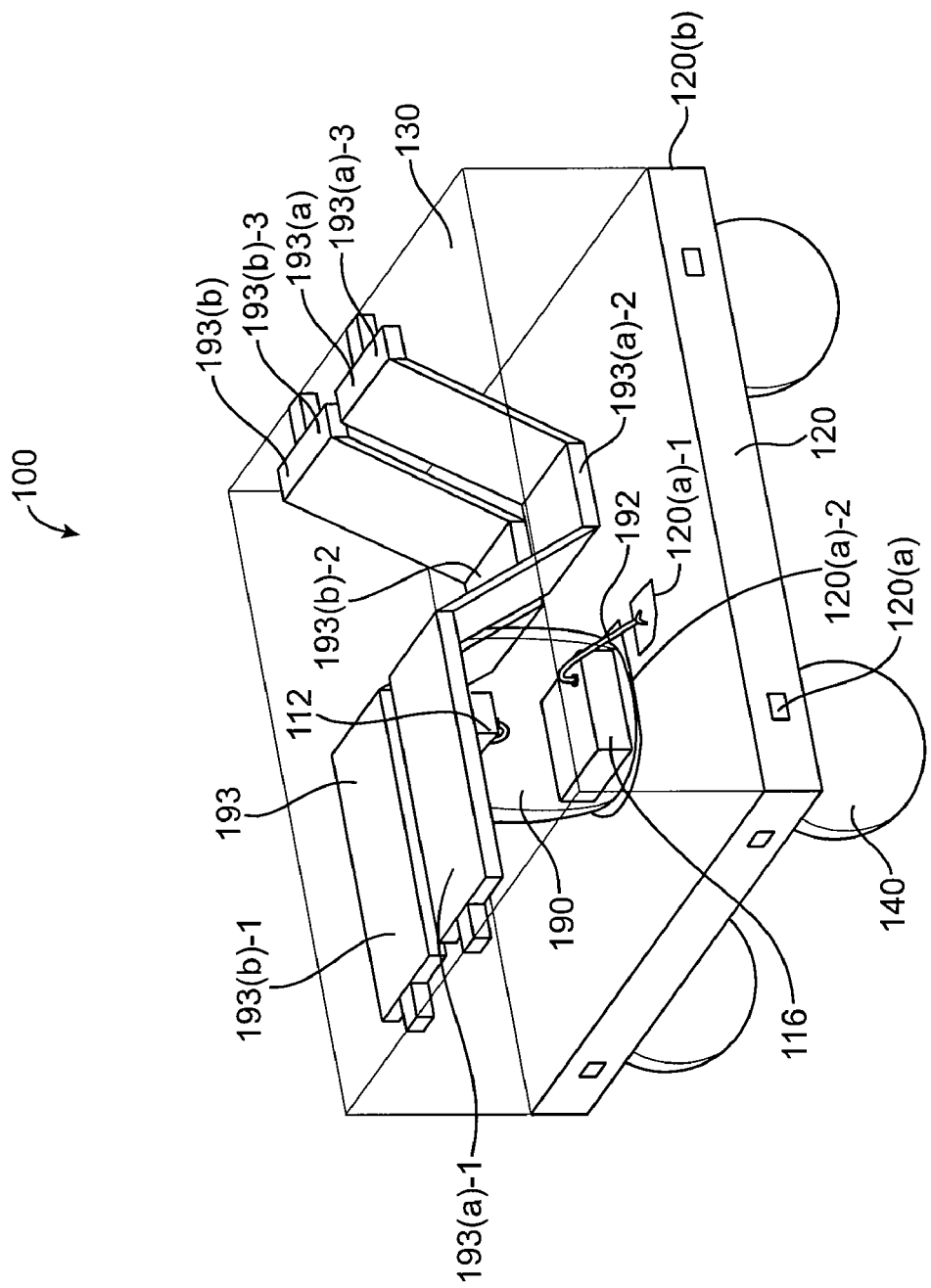
FIG. 5 shows a top perspective view of the optocoupler package embodiment shown in FIG. 2 with some internal package components being shown.

The various components in the optocoupler package 100 can be described with reference to FIGS. 5-8. FIG. 5 shows a top perspective view of the optocoupler package 100 shown in FIG. 2 with some internal package components being shown. FIG. 6. shows a top view of the optocoupler package in FIG. 2. FIGS. 7-8 respectively show side views of the optocoupler package shown in FIG. 2.

FIG. 5 shows an optical receiver device 116 (e.g., a phototransistor device) attached to an exposed surface 120(a)-2 of a leadframe structure 120(a) in the substrate 120 using solder or some other adhesive material. Another leadframe structure surface 120(a)-1 that is exposed through the molding material 120(b) may be a wirebond pad for a wire 192 connecting the surface 120(a)-1 to a top surface of the optical receiver device 116. An external surface of the molding material 120(b) of the substrate 120 is substantially coplanar with leadframe structure surfaces 120(a)-1, 120(a)-2 of the leadframe structure 120(a).

A first leadframe structure 193 is attached to the substrate 120. The first leadframe structure 193 includes first and second sections 193(a), 193(b), where each section 193(a), 193(b) includes a second central portion 193(a)-2, 193(b)-2 which forms a concave shape. Each second central portion 193(a)-2, 193(b)-2 is attached to the substrate 120 using any type of adhesive. Each central portion 193(a)-2, 193(b)-2 is between a first planar portion 193(a)-1, 193(a)-1 and a third planar portion 193(a)-3, 193(b)-3.

Referring to FIGS. 5, 7, and 8, an optical emitter device 112 (e.g., an LED device) is attached to the first portion 193(a)-1 of the first section 193(a) of the first leadframe structure 193. As specifically shown in FIG. 8, a wire 194 electrically couples the optical emitter device 112 to the first portion 193(b)-1 of the second section 193(b) of the first leadframe structure 193.

Referring to FIGS. 5, 7, and 8, a light transmissive material 190 covers at least part of the optical emitter device 112 and the optical receiver device 116. The light transmissive material 190 serves as a light transmission medium between the optical emitter device 112 and the optical receiver device 116. The light transmissive material 190 may be referred to as a "light coupling gel" in some cases. The light transmissive material 190 also may be coated with a reflective material such as silver paint, or an opaque material such as an epoxy glob top material, so that any light emitted from the optical emitter device 112 is reflected towards the optical receiver device 116.

Referring to FIGS. 5, 7, and 8, the first portion 193(a)-1 of the first section 193(a) of the first leadframe structure 193, and the optical emitter device 112, face and overlap with the optical receiver device 116. A light emitting surface 112(a) of the optical emitter device 112 may face a light receiving surface 116(a) of the optical receiver device 116. The spacing between the light emitting surface 112(a) and the light receiving surface 116(a) can be about 0.45 mm in some embodiments of the invention. Because the light emitting surface 112(a) of the optical emitter device 112 faces the light receiving surface 116(a) of the optical receiver device 116, light is advantageously efficiently transmitted from the light emitting surface 112(a) to the light receiving surface 116(a).

Also as shown in FIGS. 7-8, the top surfaces of the first and third portions 193(b)-1, 193(b)-3 of the second leadframe structure section 193(b) are exposed by and are substantially coplanar with the upper exterior surface of the housing 130. Because portions of the first leadframe structure 193 are exposed, heat is readily dissipated from any devices (e.g., the optical emitter device 112) in the optocoupler package 100.

Figure 9:
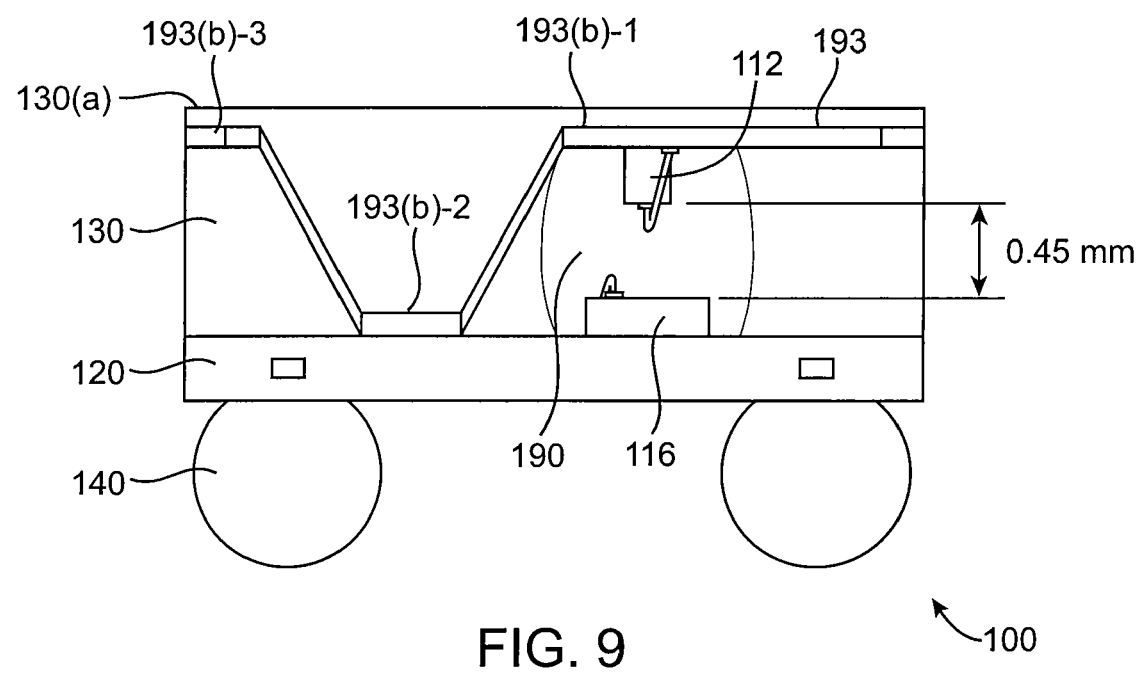
FIG. 9 shows a side view of another optocoupler package embodiment of the invention.

FIG. 9 shows a side view of another optocoupler package 100 embodiment of the invention. The optocoupler package 100 shown in FIG. 9 is similar to the optocoupler package 100 in FIG. 7, except that a housing portion 130(a) comprising a molding material covers the top surface of the first leadframe structure 193 and the top surface of the leadframe structure 193 is not exposed.

Other embodiments of the invention are directed to methods for forming optocoupler packages and other types of packages. In one embodiment, the method comprises obtaining a substrate, and then attaching (either directly or indirectly through an additional structure) a first optoelectronic device to the substrate. A second optoelectronic device is then attached to a first portion of a leadframe structure. After the second optoelectronic device is attached to the leadframe structure, the leadframe structure is attached to the substrate. After attaching the leadframe structure to the substrate, the first portion of the leadframe structure, and preferably the second optoelectronic device, are disposed over the first optoelectronic device. Methods according to embodiments of the invention can be further described with reference to FIGS. 10(a)-10(m) and 11(a)-11(f).

FIG. 10(a) shows a perspective view of an array of second leadframe structures 120(a). The array of second leadframe structures 120(a) can be used to form premolded substrates. The second leadframe structures 120(a) can be obtained by etching, stamping, or any other suitable process. As shown, each of the second leadframe structures 120(a) can include die attach pads, and pads for solder balls (e.g., lead or lead-free solder balls) or the like. Some regions may be partially etched (e.g., half etched) to help lock a molding material to the second leadframe structures 120(a).

FIG. 10(b) shows a perspective view of premolded substrates 120 after a molding material 120(b) is formed around the second leadframe structures 120(a). Any suitable molding process including a tape assisted molding process may be used.

As shown in FIG. 10(c), after the premolded substrate 120 is formed, a plurality of optical receiver devices 116 is attached to exposed surfaces of the leadframe structures 120(a) in the premolded substrates 120. Solder or some other conductive adhesive may be used to attach the optical receiver devices 116 to the premolded substrates 120.

Then, as shown in FIG. 10(d), wirebonds 192 are formed between other exposed surfaces of the leadframe structures 120(a) and the previously attached optical receiver devices 116. Wirebonding processes are known in the art.

Referring to FIGS. 10(e)-10(g), before, after, or during the formation of the precursor shown in FIG. 10(d), optical emitter devices 112 can be mounted on first leadframe structures 193 in an array of first leadframe structures. The first leadframe structures 193 can be obtained by etching, stamping, or any other suitable process.

As shown in FIG. 10(f), optical emitter devices 112 can be mounted on the first leadframe structures 193. After the optical emitter devices 112 are mounted on the first leadframe structures 193, wirebonds 194 can be formed between the optical emitter devices 112 and other portions of the first leadframe structures 193 as shown in FIG. 10(g).

As shown in FIG. 10(h), the precursor shown in FIG. 10(g) can be flipped over and then mounted to the substrate precursor. Solder or some other adhesive material can be used to attach the illustrated precursors together.

Then, as shown in FIG. 10(i), light transmissive material structures 190 can be formed on the optical emitter devices 112 and the optical receiver devices 116. The formation of the light transmissive material structures 190 can be described in further detail with reference to FIGS. 11(a) to 11(f).

Referring to FIG. 11(a), a paper insert 178 (or other type of insert) can be inserted to a leadframe structure 193 and substrate 120 combination so that it is perpendicular to the orientation of the substrate 120 and the first leadframe structure 193.

As shown in FIG. 11(b), in a first deposition step, a light transmissive material 190 is deposited on parts of the optical emitter device 112 and the optical receiver device. Then, as shown in FIG. 11(c), the formed precursor structure is flipped over. After turning the precursor structure over, in a second deposition step, the light transmissive material 190 is then deposited on the uncoated portions of the optical emitter device 112 and the optical receiver device 116. Once the optical emitter device 112 and the optical receiver device 116 are completely coated, the paper insert 178 or portions thereof are removed as shown in FIG. 11(e). Any paper that is between the two portions of deposited light transmissive material 190 may remain between the portions in the package. The resulting precursor structure is shown in FIG. 11(f), and is also shown in FIG. 10(i). In other embodiments, a single deposition process could be used.

Referring to FIG. 10(j), after forming the light transmissive material structures 190, a molding process is formed to form a molding material 130 around portions of the light transmissive structures 190, the first leadframe structures 193, and the premolded substrates 120. Suitable molding processes are known in the art.

After molding is performed, solder balls 140 are deposited on the precursor shown in FIG. 10(j). Suitable solder deposition processes are known in the art.

As shown in FIG. 10(l), after solder processing, an array of packages is formed, and the packages in the array are then singulated using a singulation tool such as a saw. A singulated package 100 is shown in FIG. 10(m). The formed packages 100 may then be tested, and marked if desired.

Although specific orders of steps are described, it is understood that embodiments of the invention need not be limited to the order of steps specifically described herein.

In the descriptions provided herein, words such as "top", "bottom", etc. refer to the positions of various components shown in the Figures. Such words may or may not refer to absolute positions of such components in a package.

The above-described optocoupler packages can be used in electrical assemblies including circuit substrates, as well as systems which may be embodied by cell phones and computers.

While the foregoing is directed to certain preferred embodiments of the present invention, other and further embodiments of the invention may be devised without departing from the basic scope of the invention. Such alternative embodiments are intended to be included within the scope of the present invention. Moreover, the features of one or more embodiments of the invention may be combined with one or more features of other embodiments of the invention without departing from the scope of the invention.

What is claimed is:

1. A package comprising:
    a substrate comprising a first planar surface and a second planar surface opposite the first planar surface;
    a first device attached to the substrate;
    a leadframe structure attached to the substrate, wherein the leadframe structure comprises a first planar leadframe structure portion, and a second planar leadframe structure portion, wherein the first planar leadframe structure portion is disposed over the first device and the second leadframe structure portion is attached to the first planar surface of the substrate; and
    a second device attached to the first planar leadframe structure portion of the leadframe structure,
    wherein the first device is attached to the first planar surface of the substrate, and wherein the package further comprises a plurality of solder balls attached to the second planar surface of the substrate,
    wherein solder balls in the plurality of solder balls are electrically coupled to the first device and to the second device through the substrate.

2. An optocoupler package comprising:
    a substrate comprising a first planar surface and a second planar surface opposite the first surface;
    a first optoelectronic device attached to the substrate;
    a leadframe structure attached to the substrate, wherein the leadframe structure comprises a first planar leadframe structure portion, and a second planar leadframe structure portion, wherein the first planar leadframe structure portion is disposed over the first optoelectronic device and the second leadframe structure portion is attached to the first planar surface of the substrate; and
    a second optoelectronic device attached to the first planar leadframe structure portion of the leadframe structure,
    a plurality of solder balls attached to the second planar surface of the substrate,
    wherein solder balls in the plurality of solder balls are electrically coupled to the first optoelectronic device and to the second optoelectronic device through the substrate.

3. The optocoupler package of claim 2 wherein the first optoelectronic device is an optical receiver device and the second optoelectronic device is an optical emitter device.

4. The optocoupler package of claim 2 further comprising a first wire coupling the first optoelectronic device to the substrate and a second wire coupling the second optoelectronic device to another portion of the leadframe structure.

5. The optocoupler package of claim 2 wherein the first optoelectronic device is a phototransistor device or an LED device and the second optoelectronic device is an LED device or a phototransistor device.

6. The optocoupler package of claim 2 further comprising a housing comprising a molding material covering at least part of the first and second optoelectronic devices.

7. The optocoupler package of claim 6 wherein surfaces of the leadframe structure are exposed by the housing and are substantially coplanar with an exterior surface of the housing.

8. The optocoupler package of claim 6 wherein the molding material covers a top surface of the leadframe structure.

9. The optocoupler package of claim 2 further comprising a light transmissive material covering the first and second optoelectronic devices.

10. The optocoupler package of claim 9 further comprising a reflective material covering the light transmissive material.

11. The optocoupler package of claim 2 wherein the leadframe structure comprises a third planar leadframe structure portion, wherein the first, second, and third planar leadframe structure portions form a concave structure.

12. The optocoupler package of claim 11 wherein the leadframe structure is a first leadframe structure and wherein the substrate comprises a second leadframe structure.

13. The optocoupler package of claim 2 wherein the leadframe structure is a first leadframe structure and wherein the substrate comprises a second leadframe structure.

14. The optocoupler package of claim 13 further comprising a molding material covering the first and second optoelectronic devices, and wherein a surface of the first leadframe structure portion is exposed through the molding material.

15. A method for making a package, the method comprising:
    obtaining a substrate comprising a first planar surface and a second planar surface opposite the first planar surface;
    attaching a first device to the first planar surface of the substrate;
    attaching a second device to a first planar leadframe structure portion of a leadframe structure, the leadframe structure also comprising a second planar leadframe structure portion;
    attaching the second planar leadframe structure portion of the leadframe structure to the first planar surface of the substrate, wherein the first planar leadframe structure portion of the leadframe structure is positioned over the first device; and
    attaching a plurality of solder balls to the second planar surface of the substrate, wherein the solder balls in the plurality of solder balls are electrically coupled to the first device and the second device through the substrate.

16. A method for making an optocoupler package
    obtaining a substrate comprising a first planar surface and a second planar surface opposite to the first planar surface;
    attaching a first optoelectronic device to the substrate;
    attaching a second optoelectronic device to a first planar leadframe structure portion of a leadframe structure, the leadframe structure also comprising a second planar leadframe structure portion;
    attaching the second planar leadframe structure portion of the leadframe structure to the first planar surface of the substrate, wherein the first leadframe structure portion of the leadframe structure is positioned over the first optoelectronic device; and
    attaching a plurality of solder balls to the second planar surface of the substrate, wherein the solder balls in the plurality of solder balls are electrically coupled to the first optoelectronic device and the second optoelectronic device through the substrate.

17. The method of claim 16 wherein the first optoelectronic device is an optical receiver device and the second optoelectronic device is an optical emitter device.

18. The method of claim 16 wherein the first optoelectronic device is a phototransistor device or an LED device and the second optoelectronic device is an LED device or a phototransistor device.

19. The method of claim 16 further comprising molding a molding material around both the first and second optoelectronic devices in a single molding process.

20. The method of claim 19 further comprising further comprising forming a light transmissive material around the first and second optoelectronic devices.

21. The method of claim 16 wherein the substrate is a premolded substrate.

22. The method of claim 16 further comprising forming a light transmissive material structure around the first and second optoelectronic devices, wherein forming the light transmissive material structure occurs in at least two deposition steps.

* * * * *

UNITED STATES PATENT AND TRADEMARK OFFICE
CERTIFICATE OF CORRECTION

PATENT NO. : 7,791,084 B2  Page 1 of 1
APPLICATION NO. : 11/971512
DATED : September 7, 2010
INVENTOR(S) : Yong Liu et al.

It is certified that error appears in the above-identified patent and that said Letters Patent is hereby corrected as shown below:

Col. 10, lines 1-2, Claim 20, delete the second "further comprising."

Signed and Sealed this

Sixteenth Day of November, 2010

David J. Kappos
*Director of the United States Patent and Trademark Office*